United States Patent
Shan et al.

(10) Patent No.: US 8,402,423 B2
(45) Date of Patent: Mar. 19, 2013

(54) SYSTEM AND METHOD FOR VERIFYING PCB LAYOUT

(75) Inventors: Zheng Shan, Shenzhen (CN); Shi-Piao Luo, Shenzhen (CN); Chia-Nan Pai, New Taipei (TW); Shou-Kuo Hsu, New Taipei (TW)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/244,625

(22) Filed: Sep. 25, 2011

(65) Prior Publication Data
US 2012/0185819 A1   Jul. 19, 2012

(30) Foreign Application Priority Data
Jan. 13, 2011  (CN) .......................... 2011 1 0006941

(51) Int. Cl.
*G06F 17/50* (2006.01)
*G06F 9/455* (2006.01)

(52) U.S. Cl. ........ 716/137; 716/132; 716/135; 716/136; 716/139

(58) Field of Classification Search ........................ None
See application file for complete search history.

(56) References Cited

U.S. PATENT DOCUMENTS

| | | | | |
|---|---|---|---|---|
| 6,829,749 B2 * | 12/2004 | Osaka et al. | ................... | 716/102 |
| 6,834,380 B2 * | 12/2004 | Khazei | ........................... | 716/115 |
| 6,845,492 B1 * | 1/2005 | Frank et al. | ................... | 716/112 |

* cited by examiner

*Primary Examiner* — A. M. Thompson
(74) *Attorney, Agent, or Firm* — Altis Law Group, Inc.

(57) ABSTRACT

In a method for verifying a printed circuit board (PCB) layout using a computing device, a PCB simulation file is obtained from a storage device of the computing device, and a PCB image is displayed on a display device according to the PCB simulation file. The PCB image includes multiple signal lines and switching voltage regulator nodes (SVRN). A SVRN to be checked is selected from the PCB image, and all signal lines around the SVRN are searched. The method calculates a layout distance between the selected SVRN and each of the searched signal lines, and generates a graphical window interface to position a signal line whose layout distance is equal to or less than the minimum distance. The method further modifies the layout of the positioned signal line to satisfy a layout design specification by increasing the layout distance to the minimum distance.

18 Claims, 3 Drawing Sheets

SYSTEM AND METHOD FOR VERIFYING PCB LAYOUT

BACKGROUND

1. Technical Field

The embodiments of the present disclosure relate to printed circuit board (PCB) checking systems and methods, and more particularly to a system and method for verifying a layout of a PCB using a computing device.

2. Description of Related Art

Electronic devices, such as computers and servers, may include one or more printed circuit boards (PCBs) that includes a plurality of electronic components, such as processors, memories, audio, and video cards. Quality of the PCBs delivered from the factory needs to be strictly controlled. In order to assure the stability and reliability of a PCB, it is necessary to perform a series of verification tests of the layout of the PCB before shipping. In traditional test methods, the verification test may be performed manually, which may be complicated, inefficient, and costly. Therefore, a more efficient system and method for verifying a layout of a PCB is desired.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
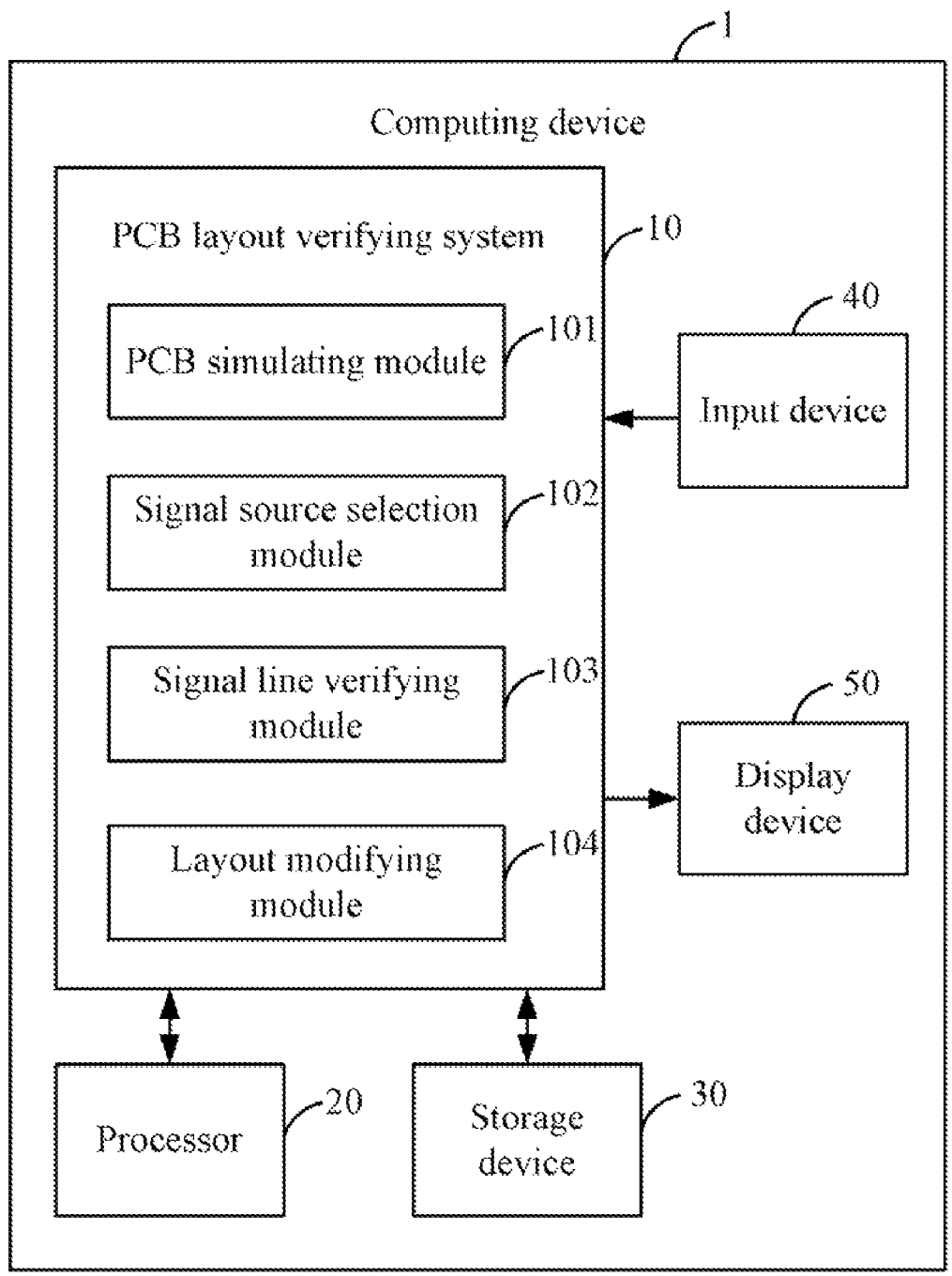
FIG. 1 is a block diagram of one embodiment of a computing device including a PCB layout verifying system.

FIG. 1 is a block diagram of one embodiment of a computing device 1 including a printed circuit board (PCB) layout verifying system 10. In the embodiment, the PCB layout verifying system 10 is implemented by the computing device 1, such as a desktop computer, a workstation computer, or a server. The computing device 1 may further include a processor 20, a storage device 30, an input device 40, and a display device 50. It is understood that FIG. 1 is only one example of the computing device 1 that can include more or fewer components than those shown in the embodiment, or show a different configuration of the various components.

The storage device 30 stores a PCB simulation file that includes layout information of a PCB, including a layout design specification for designing the PCB. In the embodiment, the PCB may includes a plurality of electronic components, and a plurality of signal lines between every electronic component of the PCB. The electronic components may include, but are not limited to, resistors, capacitors, and inductors. The input device 40 may be a keyboard, and the display device 50 may be a display screen.

The PCB layout verifying system 10 includes computerized instructions in the form of one or more programs that are executed by the at least one processor 20, and stored in the storage device 30. In one embodiment, the storage device 30 may be an internal storage system, such as a random access memory (RAM) for the temporary storage of information, and/or a read only memory (ROM) for the permanent storage of information. In some embodiments, the storage device 30 may also be an external storage system, such as an external hard disk, a storage card, or a data storage medium.

In one embodiment, the PCB layout verifying system 10 includes a PCB layout simulating module 101, a signal source selection module 102, a signal line verifying module 103, and a layout modifying module 104. The modules 101-104 may comprise computerized code in the form of one or more programs that are stored in the storage device 30 and executed by the processor 20 to provide functions for implementing the modules. In general, the word "module," as used herein, refers to logic embodied in hardware or firmware, or to a collection of software instructions, written in a programming language. In one embodiment, the program language may be Java, C, or assembly. One or more software instructions in the modules may be embedded in firmware, such as in an EPROM. The modules described herein may be implemented as either software and/or hardware modules and may be stored in any type of non-transitory computer-readable medium or other storage device. Some non-limiting examples of non-transitory computer-readable media include CDs, DVDs, flash memory, and hard disk drives.

Figure 2:
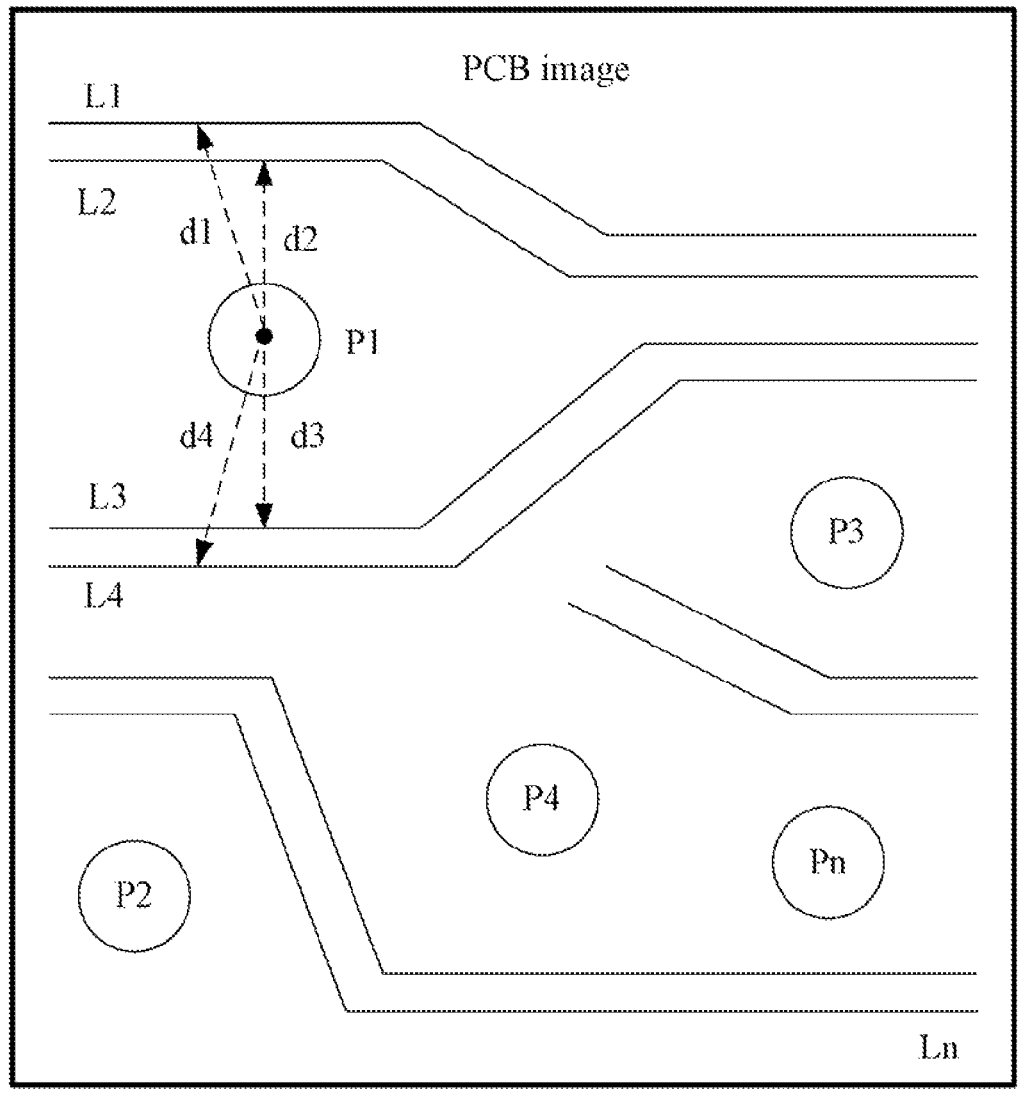
FIG. 2 is a schematic diagram illustrating an example of a PCB image.

The PCB layout simulating module 101 is operable to obtain the PCB simulation file from the storage device 30, and display a PCB image on the display device 50 according to the PCB simulation file. In one embodiment, the PCB image includes a plurality of signal lines and a plurality of switching voltage regulator nodes (SVRN). Each of the signal lines may be used to connect components positioned around the SVRNs. The SVRN is a circuit node that includes one or more electronic components of the PCB, and may generate interference noises between each of the signal lines when the output voltage of the circuit node is changed. In one example as shown in FIG. 2, there are N numbers of signal lines L1, L2, L3, L4, . . . , Ln, and N numbers of SVRNs P1, P2, P3, P4, . . . , Pn.

The PCB layout simulating module 101 is further operable to set a minimum distance between each of the SVRNs and a signal line around the SVRN through the input device 50. In the embodiment, the minimum distance is preset according to the layout specification stored in the storage device 30. For example, the minimum distance may be preset as 263 mil according to the layout design specification, as adjusted by designer input from the input device 50.

The signal source selection module 102 is operable to select a SVRN to be checked from the PCB image, and search all of the signal lines that are around the SVRN from the PCB image. Referring to FIG. 2, the SVRN P1 may be selected, and the signal lines L1, L2, L3, L4 are searched around the SVRN. The signal source selection module 102 is further operable to determines whether all of the SVRNs of the PCB image have been selected to be verified.

The signal line verifying module 103 is operable to calculate a layout distance between the selected SVRN and each of the searched signal lines. Referring to FIG. 2, the layout distance between the SVRN P1 and the signal line L1 is calculated as "d1," the layout distance between the SVRN P1 and the signal line L2 is calculated as "d2," the layout distance between the SVRN P1 and the signal line L3 is calculated as "d3," and the layout distance between the SVRN P1 and the signal line L4 is calculated as "d4."

The signal line verifying module 103 is further operable to verify whether the layout of each of the searched signal lines satisfies the layout design specification by determining if the layout distance is greater than the minimum distance. In one embodiment, if the layout distance is greater than the minimum distance, the signal line verifying module 103 generates layout verification information to indicate that the layout of the signal line satisfies the layout design specification, and displays the layout verification information on the display device 50. If the layout distance is equal to or less than the minimum distance, the signal line verifying module 103 indicates that the layout of the signal line does not satisfy the layout design specification, and the layout of that particular signal line needs to be re-designed on the PCB.

The layout modifying module 104 is operable to generate a graphical window interface on the display device 50, and to automatically position the graphical window interface on a signal line whose layout distance is equal to or less than the minimum distance. The layout modifying module 104 is further operable to modify the layout of the signal line positioned in the graphical window interface to satisfy the layout design specification by increasing the layout distance to make sure that the layout distance is greater than the minimum distance. Referring to FIG. 2, if the layout of the signal line L2 does not satisfy the layout design specification, the layout modifying module 104 automatically positions the graphical window interface on the signal line L2, and modifies the layout of the signal line L2 to increase the layout distance d2 to make sure that the layout distance d2 is greater than the minimum distance.

Figure 3:
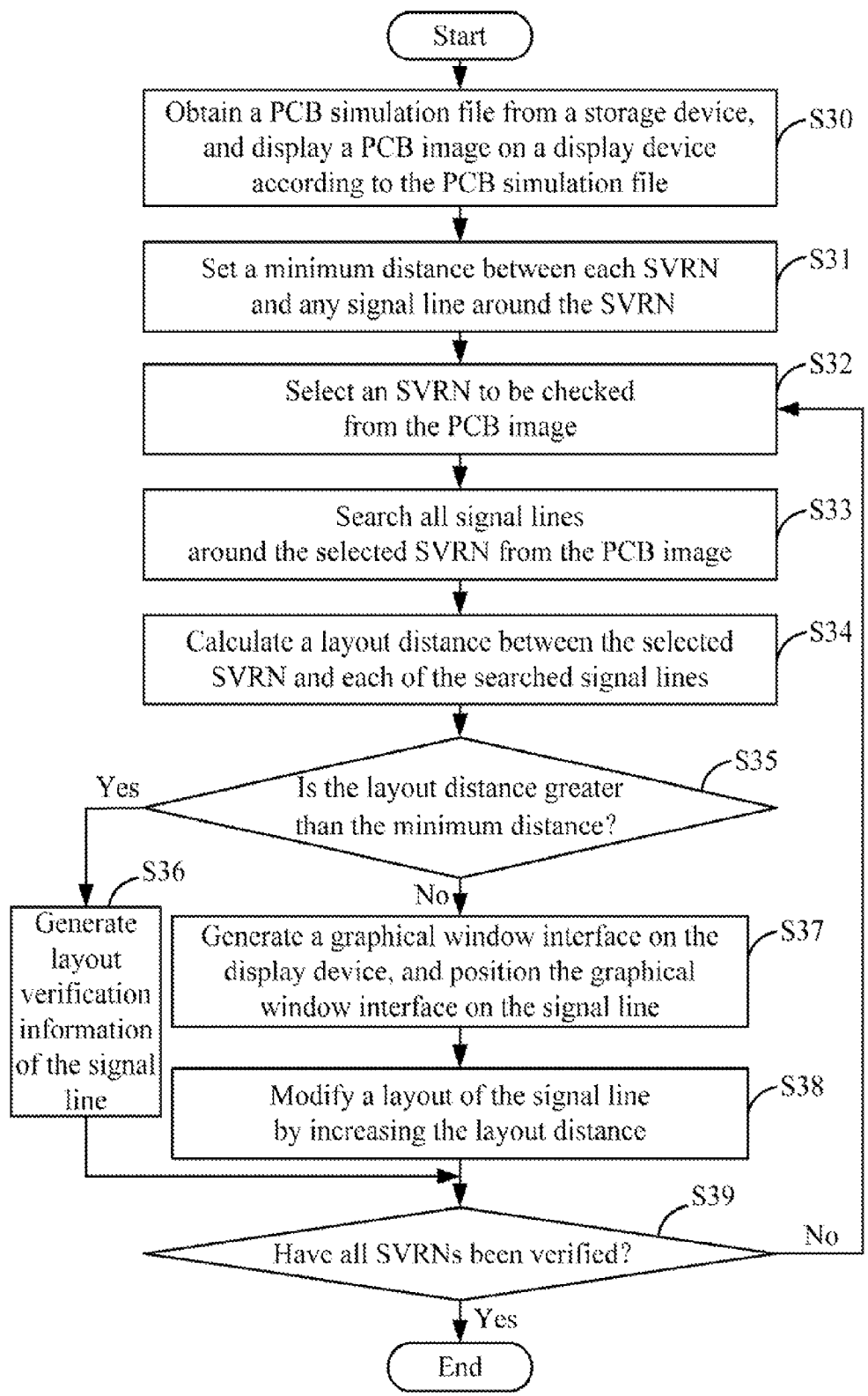
FIG. 3 is a flowchart of one embodiment of a method for verifying a PCB layout using the computing device of FIG. 1.

FIG. 3 is a flowchart of one embodiment of a method for verifying a PCB layout using the computing device 1 of FIG. 1. Depending on the embodiment, additional blocks may be added, others removed, and the ordering of the blocks may be changed.

In block S30, the PCB layout simulating module 101 obtains a PCB simulation file from the storage device 30, and displays a PCB image on the display device 50 according to the PCB simulation file. In one embodiment, the PCB image includes a plurality of signal lines and a plurality of switching voltage regulator nodes (SVRN). In one example as shown in FIG. 2, there are N numbers of signal lines L1, L2, L3, L4, . . . , Ln, and N numbers of SVRNs P1, P2, P3, P4, . . . , Pn.

In block S31, the PCB layout simulating module 101 sets a minimum distance between each of the SVRNs and any signal line around the SVRN through the input device 50. In the embodiment, the minimum distance is set according to the layout specification stored in the storage device 30, which may be 263 mil, for example, according to the layout design specification.

In block S32, the signal source selection module 102 selects a SVRN to be checked from the PCB images. In block S33, the signal source selection module 102 searches all of the surrounding signal lines around the SVRN from the PCB image. Referring to FIG. 2, the SVRN P1 may be selected to be checked, and the signal lines L1, L2, L3, L4 are searched around the SVRN.

In block S34, the signal line verifying module 103 calculates a layout distance between the selected SVRN and each of the searched signal lines. Referring to FIG. 2, the layout distance between the SVRN P1 and the signal line L1 is calculated as "d1," the layout distance between the SVRN P1 and the signal line L2 is calculated as "d2," the layout distance between the SVRN P1 and the signal line L3 is calculated as "d3," and the layout distance between the SVRN P1 and the signal line L4 is calculated as "d4."

In block S35, the signal line verifying module 103 verifies whether the layout of each of the searched signal lines satisfies the layout design specification by determining if the layout distance is greater than the minimum distance. If the layout distance is greater than the minimum distance, block S36 is implemented. Otherwise, if the layout distance is equal to or less than the minimum distance, block S37 is implemented.

In block S36, the signal line verifying module 103 generates layout verification information to indicate that the layout of the signal line satisfies the layout design specification, and displays the layout verification information on the display device 50.

In block S37, the layout modifying module 104 generates a graphical window interface on the display device 50, and automatically positions the graphical window interface on a signal line whose layout distance is equal to or less than the minimum distance. Referring to FIG. 2, if the layout of the signal line L2 does not satisfy the layout design specification, the layout modifying module 104 automatically positions the graphical window interface on the signal line L2.

In block S38, the layout modifying module 104 modifies the layout of the positioned signal line to satisfy the layout design specification by increasing the layout distance of the signal line to make sure that the layout distance is greater than the minimum distance. For example, the layout modifying module 104 may modify the layout of the signal line L2 to satisfy the layout design specification, by increasing the layout distance d2 to make sure that the layout distance d2 is greater than the minimum distance.

In block S39, the signal source selection module 102 determines whether all the SVRNs of the PCB image have been verified. If any SVRN of the PCB image still needs to be verified, block S32 is repeated. Otherwise, if all the SVRNs of the PCB image have been verified, the process ends.

All of the processes described above may be embodied in, and fully automated via, functional code modules executed by one or more general purpose processors of the computing devices. The code modules may be stored in any type of non-transitory readable medium or other storage device. Some or all of the methods may alternatively be embodied in specialized hardware. Depending on the embodiment, the non-transitory readable medium may be a hard disk drive, a compact disc, a digital video disc, a tape drive or other suitable storage medium.

Although certain disclosed embodiments of the present disclosure have been specifically described, the present disclosure is not to be construed as being limited thereto. Various changes or modifications may be made to the present disclosure without departing from the scope and spirit of the present disclosure.

What is claimed is:

1. A computing device for verifying a printed circuit board (PCB) layout, the computing device comprising:
   at least one processor;
   a storage device that stores a PCB simulation file and a layout design specification of the PCB, the PCB comprising a plurality of signal lines and switching voltage regulator nodes (SVRNs); and
   one or more modules stored in the storage system and executable by the at least one processor, the one or more modules comprising:
   a PCB layout simulating module that displays a PCB image on a display device according to the PCB simulation file, and sets a minimum distance between each switching voltage regulator node (SVRN) and any signal line around the SVRN;
   a signal source selection module that selects an SVRN to be checked from the PCB image, and searches all signal lines around the SVRN from the PCB image;
   a signal line verifying module that calculates a layout distance between the selected SVRN and each of the searched signal lines, and determines whether the layout distance is greater than the minimum distance; and a layout modifying module that generates a graphical window interface on the display device, and automatically positions the graphical window interface on the signal line whose layout distance is equal to or less than the minimum distance, and modifies a layout of the positioned signal line to satisfy the layout design specification by increasing the layout distance to make sure that the layout distance is greater than the minimum distance.

2. The computing device according to claim 1, wherein the signal source selection module further determines whether any SVRN of the PCB image has not been selected to be verified.

3. The computing device according to claim 1, wherein the signal line verifying module further generates layout verification information to indicate that the layout of the searched signal line satisfies the layout design specification and displays the layout verification information on the display device, if the layout distance is greater than the minimum distance.

4. The computing device according to claim 1, wherein the signal line verifying module further generates layout verification information to indicate that the layout of the searched signal line does not satisfy the layout design specification, if the layout distance is equal to or less than the minimum distance.

5. The computing device according to claim 1, wherein each of the signal lines is used to connect one electronic component to another electronic component of the PCB.

6. The computing device according to claim 1, wherein the SVRN is a circuit node that includes one or more electronic components of the PCB, and generates interference noises between each of the signal lines when an output voltage of the circuit node is changed.

7. A method for verifying a printed circuit board (PCB) layout using a computing device, the method comprising:
obtaining a PCB simulation file from a storage device of the computing device;
displaying a PCB image on a display device of the computing device according to the PCB simulation file, wherein the PCB image comprises a plurality of signal lines and switching voltage regulator nodes (SVRNs);
setting a minimum distance between each switching voltage regulator node (SVRN) and any signal line around the SVRN;
selecting an SVRN to be checked from the PCB image, and searching all signal lines around the SVRN from the PCB image;
calculating a layout distance between the selected SVRN and each of the searched signal lines;
determining whether the layout distance is greater than the minimum distance;
generating a graphical window interface on the display device, and positioning the graphical window interface on the signal line whose layout distance is equal to or less than the minimum distance; and
modifying a layout of the positioned signal line to satisfy a layout design specification by increasing the layout distance to make sure that the layout distance is greater than the minimum distance.

8. The method according to claim 7, further comprising:
determining whether any SVRN of the PCB image has not been selected to be verified;
when any SVRN of the PCB image needs to be verified, selecting an SVRN to be checked from the PCB image, and searching all signal lines around the SVRN from the PCB image;
calculating a layout distance between the selected SVRN and each of the searched signal lines;
determining whether the layout distance is greater than the minimum distance;
generating a graphical window interface on the display device, and positioning the graphical window interface on the signal line whose layout distance is equal to or less than the minimum distance; and
modifying a layout of the positioned signal line to satisfy a layout design specification by increasing the layout distance to make sure that the layout distance is greater than the minimum distance.

9. The method according to claim 7, further comprising:
generating layout verification information to indicate that the layout of the searched signal line satisfies the layout design specification and displaying the layout verification information on the display device, if the layout distance is greater than the minimum distance.

10. The method according to claim 7, further comprising:
generating layout verification information to indicate that the layout of the searched signal line does not satisfy the layout design specification, if the layout distance is equal to or less than the minimum distance.

11. The method according to claim 7, wherein each of the signal lines is used to connect one electronic component to another electronic component of the PCB.

12. The method according to claim 7, wherein the SVRN is a circuit node that includes one or more electronic components of the PCB, and generates interference noises between each of the signal lines when an output voltage of the circuit node is changed.

13. A non-transitory computer-readable medium having stored thereon instructions that, when executed by at least one processor of a computing device, cause the computing device to perform a method for verifying a printed circuit board (PCB) layout, the method comprising:
obtaining a PCB simulation file from a storage device of the computing device;
displaying a PCB image on a display device of the computing device according to the PCB simulation file, wherein the PCB image comprises a plurality of signal lines and switching voltage regulator nodes (SVRNs);
setting a minimum distance between each switching voltage regulator node (SVRN) and any signal line around the SVRN;
selecting an SVRN to be checked from the PCB image, and searching all signal lines around the SVRN from the PCB image;
calculating a layout distance between the selected SVRN and each of the searched signal lines;
determining whether the layout distance is greater than the minimum distance;
generating a graphical window interface on the display device, and positioning the graphical window interface on the signal line whose layout distance is equal to or less than the minimum distance; and
modifying a layout of the positioned signal line to satisfy a layout design specification by increasing the layout distance to make sure that the layout distance is greater than the minimum distance.

14. The non-transitory computer-readable medium according to claim 13, wherein the method further comprises:
determining whether any SVRN of the PCB image has not been selected to be verified;

when any SVRN of the PCB image needs to be verified, selecting an SVRN to be checked from the PCB image, and searching all signal lines around the SVRN from the PCB image;

calculating a layout distance between the selected SVRN and each of the searched signal lines;

determining whether the layout distance is greater than the minimum distance;

generating a graphical window interface on the display device, and positioning the graphical window interface on the signal line whose layout distance is equal to or less than the minimum distance; and modifying a layout of the positioned signal line to satisfy a layout design specification by increasing the layout distance to make sure that the layout distance is greater than the minimum distance.

15. The non-transitory computer-readable medium according to claim 13, wherein the method further comprises:

generating layout verification information to indicate that the layout of the searched signal line satisfies the layout design specification and displaying the layout verification information on the display device, if the layout distance is greater than the minimum distance.

16. The non-transitory computer-readable medium according to claim 13, wherein the method further comprises:

generating layout verification information to indicate that the layout of the searched signal line does not satisfy the layout design specification, if the layout distance is equal to or less than the minimum distance.

17. The non-transitory computer-readable medium according to claim 13, wherein each of the signal lines is used to connect one electronic component to another electronic component of the PCB.

18. The non-transitory computer-readable medium according to claim 13, wherein the SVRN is a circuit node that includes one or more electronic components of the PCB, and generates interference noises between each of the signal lines when an output voltage of the circuit node is changed.

* * * * *